(12) United States Patent
Grassl

(10) Patent No.: US 7,167,077 B2
(45) Date of Patent: Jan. 23, 2007

(54) PORTABLE DATA CARRIER ASSEMBLY COMPRISING A SECURITY DEVICE

(75) Inventor: Thomas Grassl, Luebeck (DE)

(73) Assignee: Giesecke & Devrient GmbH, Munich (DE)

(*) Notice: Subject to any disclaimer, the term of this patent is extended or adjusted under 35 U.S.C. 154(b) by 328 days.

(21) Appl. No.: 10/483,174

(22) PCT Filed: Jul. 9, 2002

(86) PCT No.: PCT/EP02/07651

§ 371 (c)(1),
(2), (4) Date: May 20, 2004

(87) PCT Pub. No.: WO03/007231

PCT Pub. Date: Jan. 23, 2003

(65) Prior Publication Data

US 2004/0193877 A1 Sep. 30, 2004

(30) Foreign Application Priority Data

Jul. 12, 2001 (DE) ................................. 101 33 855

(51) Int. Cl.
*H04Q 9/00* (2006.01)
*G06K 5/00* (2006.01)
*H04M 3/16* (2006.01)
*H04L 9/00* (2006.01)

(52) U.S. Cl. ..................... 340/5.61; 340/5.74; 713/164; 455/411; 455/418; 235/380

(58) Field of Classification Search ............... 340/5.61, 340/5.74; 713/164; 455/411, 418; 235/380, 235/492
See application file for complete search history.

(56) References Cited

FOREIGN PATENT DOCUMENTS

| DE | 197 38 990 A | 3/1999 |
|---|---|---|
| EP | 0 268 882 A1 | 6/1988 |
| EP | 0 565 480 A | 10/1993 |
| WO | WO 97 22086 A1 | 6/1997 |
| WO | WO 98 18102 A1 | 4/1998 |

*Primary Examiner*—Jeffery Hofsass
*Assistant Examiner*—Scott Au
(74) *Attorney, Agent, or Firm*—Rothwell Figg Ernst & Manbeck

(57) ABSTRACT

The invention relates to a portable data carrier system having a control unit, a body, a data memory integrated in a chip, in which security-relevant data can be stored, and a feature for permitting information exchange between the control unit and an external access unit. A security device of the chip transmits a security signal that is influenced by an influencing feature integrated in the body and non-electrically connected with the security device. A detection feature of the security device detects the influenced security signal, an evaluation feature evaluates the detected, influenced security signal, and a blocking feature blocks a security-critical operating state of the data carrier system if the evaluation feature does not recognize a security signal influenced in the expected way.

14 Claims, 3 Drawing Sheets

PORTABLE DATA CARRIER ASSEMBLY COMPRISING A SECURITY DEVICE

CROSS-REFERENCE TO RELATED APPLICATION

This application is a §371 of PCT Application Ser. No. PCT/EP02/07651, filed Jul. 9, 2002.

BACKGROUND OF THE INVENTION

1. Field of the Invention

This invention relates to a data carrier system.

2. Description of the Background Art

Such data carrier systems are known for example in the form of contact-type or contactless chip cards, security labels, luggage labels or vehicle keys. The control unit, data memory and part of the means for permitting information exchange are usually integrated on a chip in the form of an electronic circuit. Information exchange can be effected for example via external contacts or via inductive or capacitive antennas with a corresponding transponder device.

External access units transmit and receive information to and from the data carrier system and frequently also supply it with energy. They are usually referred to as readers despite the possibility of bidirectional communication.

Certain data carrier systems, such as cash cards, access cards or vehicle keys for activating the driving mode, deactivating immobilizers or actuating locking systems, involve the storage of security-relevant data, such as secret key data. Due to encrypted storage, such security-relevant data cannot be spied out as long as the electronic circuit configuration of the chip is not in the operating state. An attack on the security-relevant data stored in a chip consequently requires that the electronic circuit configuration of the chip is in the operating state and the security-relevant data are stored in decrypted form.

Secret data in a data carrier system can be attacked via the external contacts of a contact-type data carrier system or via the radio link of a contactless data carrier system. However, there are quite a few measures not explained in any detail here for preventing such attacks from permitting access to secret key data or other security-relevant data. A further possibility for spying out data is to attack the chip, for example by using focused ion beams or electron microscopy to determine the charge state of memory cells or the data flow on data buses. Such an attack on the chip usually requires removal of the chip or at least of a chip module with chip and contacts or trans-transponder antenna from the card. For this purpose the card is usually greatly damaged or the card material chemically dissolved.

German laid-open print DE 197 38 990 A1 discloses a chip card having a security device containing an oscillator for transmitting a security signal. The signal emitted by the oscillator is excited by a capacitance arrangement which is part of the module and produces a value that is characteristic of the sensed capacitance. Said signal is detected with a detection means, evaluated by an evaluation means, and the function of the card is enabled when the sensed capacitance matches the chip-specific capacitance.

SUMMARY OF THE INVENTION

This invention relates to a data carrier system having a control unit, data memory, a body giving the data carrier system its external form, and means for permitting information exchange between the control unit and an external access unit.

The problem of the invention is to provide a data carrier system of the above-mentioned kind that impedes attacks on the chip of said data carrier system when in the operating state.

This problem is solved by a portable data carrier system having a control unit, a body giving the data carrier system its form, a data memory integrated in a chip, in which security-relevant data can be stored, and means for permitting information exchange between the control unit and an external access unit. According to the invention, such a data carrier system has a security device for delivering a security signal, and an influencing means integrated in the body and non-electrically connected with the security device for influencing the security signal. Furthermore, the security device has a detection means for detecting the security signal influenced by the influencing means. An evaluation means is provided for evaluating the detected, influenced security signal. A blocking means blocks a security-critical operating state of the data carrier system if the evaluation means does not recognize a security signal influenced in the expected way.

The blocking of a security-critical operating state of the data carrier system can be for example the closing of an active program, the preventing of a program start or the erasure of a memory containing security-relevant data.

The control unit of an inventive data carrier system can be a logic circuit for realizing predetermined operations. Likewise, it can be a microcomputer or microcontroller with corresponding control software. The body of the data carrier system can have for example the form of a chip card or a key. However, it can also have any other form that can preferably be carried comfortably, such as jewelry to be worn on the body, a key pendant or a security label. Suitable jewelry to be worn on the body could be designed e.g. in the form of a ring, a wristwatch, a pendant or a brooch.

Means for permitting information exchange between the control unit and an external access unit can be e.g. a signal input/output device with a contact surface arrangement, or else a signal input/output device with a contactless coupling device, such as an inductive or capacitive coupling arrangement or a radio antenna.

Generic data carrier systems in the form of a chip card are known for example from Wolfgang Rankl/Wolfgang Effing, Handbuch der Chipkarten, 3$^{rd}$ edition, Carl Hansa Verlag, 1999. This book describes in particular the principles of memory cards, microprocessor cards and contactless chip cards, signal input/output devices with contacts and signal input/output devices for contactless cards.

Generic contactless data carrier systems of different designs are explained in detail in Klaus Finkenzeller, RFID-Handbuch, 2$^{nd}$ edition, Carl Hansa Verlag, 2000.

The inventive security device for transmitting a security signal and the corresponding influencing means for influencing the security signal are greatly dependent on each other and adjusted to each other. The special feature of the security device and the influencing means is that during operation of the control unit of a data carrier system it is possible to check whether the card body or at least the influencing means is in the proximity of, or actually in a certain spatial constellation relative to, the security device and thus the data memory. The transmitting power of the security device can be extremely low, since the influencing means can be disposed very closely adjacent to the security device or the signal coupling device thereof.

In a development of an inventive data carrier system, the influencing means provided is a transponder. In particular, the abovementioned "RFID-Handbuch" discloses a great number of different transponders in so-called RFID systems (from the English term "Radio Frequency IDentification"). The technical relations between transponder and reader holding for such RFID systems, such as coupling, energy transfer, signal transmission, signal evaluation, etc., are also applicable to transponders according to the present invention. A great difference between known transponders and a transponder according to the present invention is that a prior art transponder is a data carrier system communicating with a stationary reader. Such a transponder can be a generic data carrier system, as mentioned above.

A transponder of an inventive data carrier system is not provided for communication with a reader disposed outside the body of the data carrier system but for interaction with a security device disposed within the data carrier system and having at least partly the functionality of a reader with respect to the transponder. A transponder in an inventive data carrier system thus forms together with a security device an RFID system within the data carrier system. Since such a system is to be used for protecting a chip from unauthorized attacks, the stated security device is preferably integrated at least partly in the chip to be protected.

One of the special features of an inventive RFID system within the data carrier system is that the short distance within the data carrier system body permits the transmitting power to be very low and also coupling antennas or coils to be very small. On the other hand, the security device should preferably not be too complicated in structure and the energy consumption of the RFID system should preferably be low. Also, a transponder should be very small and preferably inexpensive. With consideration of these requirements, an inventive data carrier system can use for its security device and influencing means largely all technologies described in the pertinent literature. For example, a so-called 1-bit transponder can be used, which can only transfer the information "transponder present" or "transponder not present."

Additional information on the spatial arrangement of the transponder relative to the security device can in this case be derived from coupling-dependent information components of security information received by the detector device from the transponder. Furthermore, the RFID system within the data carrier system can work on a so-called radiofrequency method by which a resonant circuit is used as a transponder and the signal frequency of a security signal delivered by the security device and the resonance frequency of such a resonant circuit are adjusted to each other. The signal frequency of the security signal is preferably adapted to the actual resonance frequency of the resonant circuit, so that the transponder can be fabricated as a mass-produced article without calibration. If a fixed signal frequency is used, the resonance frequency of such a transponder arrangement that is effective for the security device can nevertheless be calibrated by a variable capacitance integrated in the security device. For this purpose, such a variable capacitance must be provided as part of a resonant circuit circuit loading the signal output of the security device and realized using a transponder arrangement.

Also, an influencing means of an inventive data carrier system can consist of a dipole with a nonlinear active element to form, in known fashion, harmonics of a microwave signal delivered by the security device, which can be evaluated by an evaluation means. In addition, the influencing means can cause the load modulation of a security signal delivered by a security device, such as in particular resistive load modulation or capacitive load modulation. Furthermore, the influencing means can be an antenna and an electronic circuit, the circuit configuration changing the load resistance of the antenna to modulate the reflection cross section ("modulated backscatter"). A security device in this case transmits a signal and detects the modulated signal transmitted back by the influencing means. If the modulation is suitably significant for the presence of the intact influencing means, an evaluation unit can recognize the absence of such an influencing means. If the signal amplitude of the reflected security signal, possibly additionally depending on different signal amplitudes of the security signal delivered by the security device, is used as a further criterion for the presence of the influencing means, an evaluation means of such a data carrier system will recognize with a very high degree of certainty that the data carrier system has been tampered with.

A simple embodiment of a passive influencing means can be for example a component with a complex impedance, i.e. a capacitance or inductance as part of a resonant circuit or else an independent resonant circuit. Such an impedance or resonant circuit can be provided for example by inductive or capacitive coupling as the load impedance of a radiofrequency signal generator of the security device. A relative shift of inductive coupling coils of the security device and the influencing means or a relative shift of electroconductive surfaces acting as capacitor plates of the security device and the influencing means leads to a change of coupling factor, a change of quality of such a resonant circuit and a change of resonance frequency.

The signal level of a radiofrequency generator loaded by a resonant circuit depends in nonlinear fashion on the output frequency of the radiofrequency generator or or on the offset of said output frequency of the radiofrequency generator from the resonance frequency of the resonant circuit. When the security device delivers output signals with different frequencies in the range of the resonance frequency of the resonant circuit, a detector device will determine a predictable signal level in dependence on the signal frequency within certain limits with a proper constellation of security device and influencing means. When e.g. two security signal frequencies are outputted that both deviate from the resonance frequency on the same side, the difference of the detectable output signal levels of the two frequencies will be largely the same. With close coupling and sufficient quality of the resonant circuit, external influencing variables will not have a very noticeable effect.

When a security device according to another embodiment of the invention changes the frequency of the security signal cyclically in time between two limiting frequencies continuously or in steps and detects its amplitude, the direction of change of amplitude of the security signal will change largely at the same output frequency due to the resonance frequency of the resonant circuit being exceeded. The corresponding frequency of the security signal or the relative time period between the outputting of one of the limiting frequencies and said corresponding frequency can be a measure of a security signal influenced in the expected way.

When, in one of the two cases described by way of example above, the influencing means is removed, replaced by another influencing means differing in impedance or coupling behavior or when the distance between the coupling elements of the influencing means and the security device changes in any direction, this leads to a significant change of resonance frequency and/or quality of the resonant circuit and/or coupling factor. An evaluation means can therefore not recognize the security signal influenced in the expected way.

Preferably, the security device can be calibrated for example after the end of assembly of the data carrier system. This permits physical peculiarities of the specific influencing means and any peculiarities of the relative position of security device and influencing means to be compensated. For example, the signal frequency of a security signal can be calibrated in dependence on the actual resonance frequency or the actual frequency-dependent behavior of the influencing means, or the resonance frequency can be calibrated by capacitances effective for the resonant circuit. Thus, significant features of the detected-security signal can be adjusted as an evaluation criterion for the intactness of the security device, the influencing means and the part of the card body located therebetween.

In a preferred embodiment of an inventive data carrier system, the evaluation means tests two or more pieces of information that are dependent on the presence of a required influencing means. This permits the limiting values of the individual kinds of information, i.e. the permissible deviations from the ideal value, to be selected with greater tolerance, or security to be increased with the same tolerance of said limiting values. Preferably, one of the kinds of information is dependent on the signal amplitude of the detected security signal, so that not only the absolute presence of the influencing means but also the arrangement of the influencing means relative to the security device and thus to the chip with the security-relevant data can be considered as an evaluation criterion in simple fashion.

When the permissible limiting values of the evaluation means are definable for such information dependent on the signal amplitude after assembly of the data carrier system, said limiting values can be narrowly selected and a change of position of the influencing means-relative to the security device or a simulated influenced security signal will with high probability not lead to a detected security signal influenced in the expected way in the security device.

Another possible combination of security device and simple, passive influencing means provides for a delay unit, such as a strip line arrangement, as the influencing means. When a security device related with the chip couples a pulsed signal of very high frequency capacitively into such a delay unit and the detecting means capacitively couples out said signal phase-shifted by the delay unit, the phase shift between coupled in security signal and coupled out security signal is a significant feature for the presence of the undestroyed influencing means. The pulsed security signal can be pulse width modulated, pulse code modulated or otherwise coded. The only essential thing is that the phase shift caused by the influencing means is detectable by a detection detection means. If the phase position between transmitted security signal and detected, i.e. received, security signal is not within an expected range in such a data carrier system after attempted tampering, an evaluation means cannot recognize a security signal influenced in the expected way.

If capacitive coupling of the security signal is provided, this is preferably done between an electroconductive surface of the security device on the chip or on a module firmly connected with the chip and an electroconductive surface of the influencing means in the body of the data carrier system. Thus, the relative position of influencing means and chip immediately influences the coupling capacitance. If the influencing means is part of a resonant circuit or is a delay unit, the coupling capacitance immediately influences the frequency-dependent behavior of the influencing means: In addition, the coupling capacitance also influences the amplitude of the transferred security signal within certain limits.

A similar relation as for capacitive coupling also holds for inductive coupling, if an inductance of the security device forms an inductive transducer due to spatial association with an inductance of the influencing means. Here, too, the coupling factor, the quality and the resulting inductance effective for the security device depend significantly on the position of the two inductances relative to each other.

In particular in the case of high security requirements, the influencing means can be a transponder with active elements and an energy coupling apparatus for transferring electric energy from the chip to the influencing means. In such a case, the simplest form of security signal can be a signal with alternating amplitude, such as a clock signal, that guarantees the energy supply of such a transponder. One embodiment of such a transponder can deliver for example stored information. Said information can be transferred e.g. by load modulation of the security signal or by delivery of a transmit signal to the detection means of the security device. In the case of load modulation, the security signal is immediately influenced by the transponder. In the case of independent transmission of stored information, this influencing consists in converting the security signal to a supply voltage and delivering an independent information signal formed from said supply voltage.

Besides the presence of the information delivered by the transponder, a delay time between commencement of the security signal and delivery of the information that is random for each transponder can be provided for example as an evaluation criterion of the evaluation means.

In an especially favorable embodiment of an inventive data carrier system, the evaluation criterion of the evaluation means can be calibrated to physical properties, such as a resonance frequency or a delay time of the influencing means. Thus, an influencing means simulated with fraudulent intent cannot cause an expected influencing of the security signal.

An especially secure embodiment of an inventive data carrier system provides for an influencing means in the form of a transponder that processes digital information in a security signal in a way predictable only to the security device and transfers the result of said processing to the security device. By transmitting random bit strings, the security device can tell by the detected result with certainty whether the influencing means is still present in the original state. When an analog value component is additionally used as an evaluation criterion in such a case, the original state of the data carrier system can also be tested. Besides a check of the amplitude or the root-mean-square value of a detected signal received from the influencing means, a delay time can for example also be such an analog component. For example, a capacitive coupling between security device and influencing means can be provided, the spatial arrangement of the influencing means relative to the security device defining the amount of the capacitance. Such a capacitance can be formed for example by contactlessly overlapping metallic surfaces of the influencing means and a chip module containing the security device together with the body material located between said surfaces. Not only the superficial extent of the individual metallic surfaces but also the degree of overlap thereof, the distance between the surfaces and the electric constant of the body material located therebetween determine the capacitance. Each spatial change of the position of said surfaces relative to each other thus leads to a change of capacity. When a thus defined capacitance is used for example as the controlling factor for a delay time between an action of the security device and a reaction of the influencing means, and the limiting values of said delay time are determined after the final assem-determined after the final assembly of the data carrier system and adjusted in the evaluation means, tampering with the chip, the body material or the influencing means will lead with high probability to an impermissible deviation of the signal detected by the detection means that is recognizable to the evaluation means. A similar effect can also be achieved with inductive coupling.

BRIEF DESCRIPTION OF THE DRAWINGS

For better signal coupling between the security device and the influencing means or also for reasons of energy saving, it is recommendable to dispose the influencing means immediately adjacent to the chip in the body of the data carrier system.

In the following the invention will be explained in more detail with reference to the figures of the drawing, in which.

DETAILED DESCRIPTION OF THE INVENTION

In the figures, the same reference signs designate the same functional units, and reference signs with the same reference numbers embodiments of the functional units with corresponding reference signs.

Figure 1:
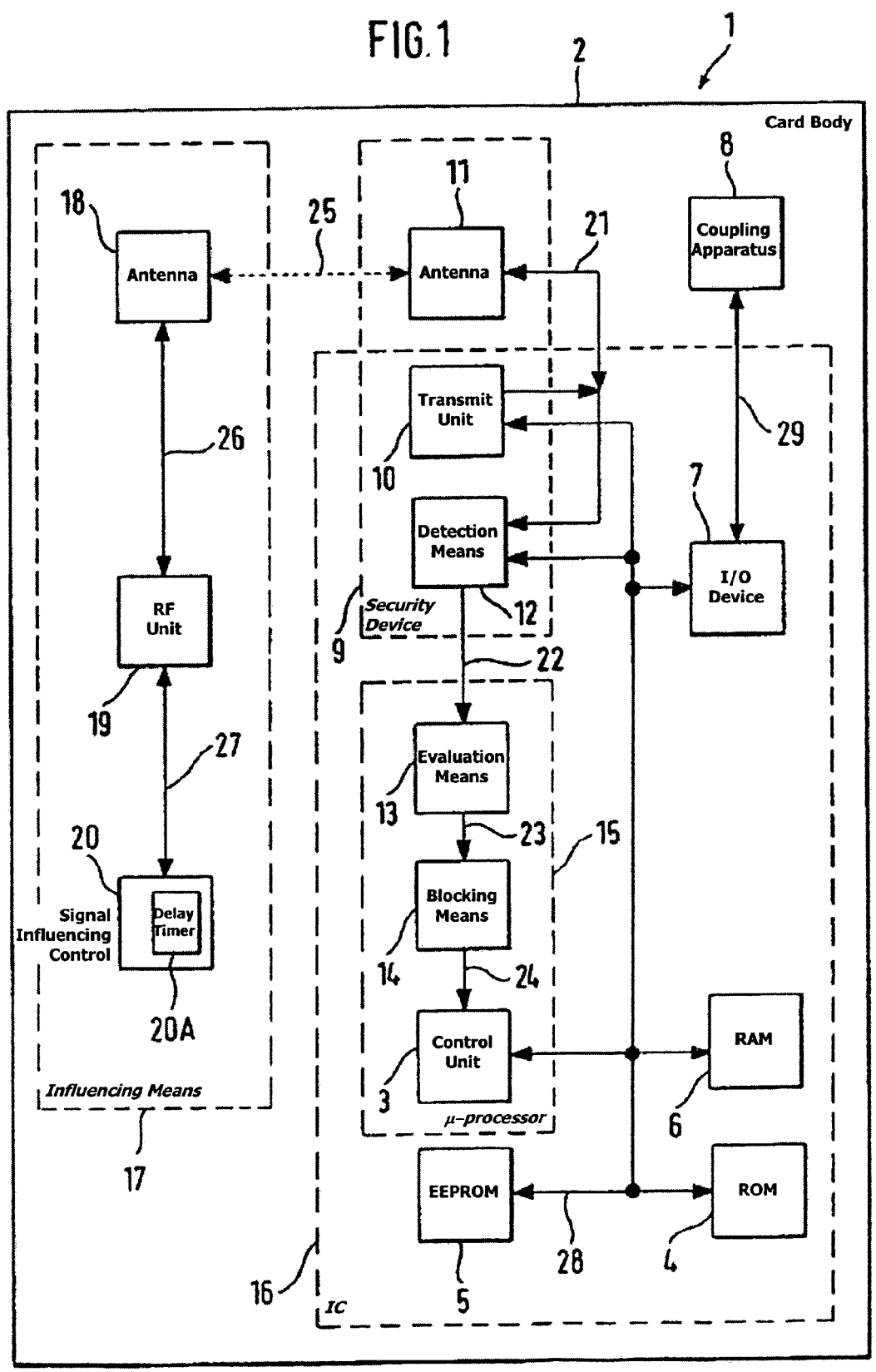
FIG. 1 shows a schematic block representation of a first special embodiment of an inventive data carrier system.

FIG. 1 shows data carrier system 1 with body 2 giving the data carrier system its external form. Data carrier system 1 contains in known fashion chip 16 and coupling apparatus 8 for permitting information exchange, for example a contact bank or antenna. The chip of the shown embodiment has microprocessor 15 that realizes control unit 3 for controlling the functional routines of the data carrier system. Control unit 3 is connected via control and data bus 28 with read-only data memory 4 realized by a ROM, nonvolatile memory 5 realized by an EEPROM and working memory 6 realized by a RAM. Data and control bus 28 is furthermore connected with input/output device input/output device 7 permitting information exchange via coupling apparatus 8 with an external read/write device not shown in the figure. Input/output device 7 can contain for example a voltage stabilizing device, a clock generating device and a driver arrangement depending on the kind of information exchange and optionally the energy exchange via the coupling apparatus. In the case of contactless information exchange, a modem and a transceiver can also be provided in input/output device 7. Input/output device 7 is connected with coupling apparatus 8 via connection 29 for exchanging information and supply energy.

According to the invention, security device 9 is provided having antenna 11 as the coupling unit of security device 9, transmitting unit 10 for transmitting a security signal via antenna 11 and a receiver/demodulator as detection means 12. Antenna 11 is connected via security signal line 21 with transmitting unit 10 and detection means 12. Transmitting unit 10 and receiver/demodulator 12 are integrated in chip 16 in the shown embodiment and controlled by control unit 3 for controlling the functional routines of data carrier system 1. Detection means 12 is connected via connection 22 for transferring the detected, influenced security signal with evaluation means 13 realized by microprocessor 15. Evaluation means 13 is connected via connection 23 for transferring the evaluation result with blocking means 14, which is likewise realized by microprocessor 15. Blocking means 14 transfers blocking information via connection 24 to control unit 3 of the data carrier system. Connections 23 and 24 are shown primarily for illustrating the information flow between functional blocks 13, 14 and 3. The actual information flow takes place in the usual way within microprocessor 15.

Body 2 also contains influencing means 17 having antenna 18 as the coupling unit of influencing means 17. Antenna 18 is connected via security signal line 26 with radiofrequency unit 19, which is in turn connected via information line 27 with signal influencing control 20. In the shown embodiment of FIG. 1, signal influencing control 20 furthermore has delay timer 20a whose time constant is determined in a way not shown by a capacitance that depends on the arrangement of influencing means 17 in body 2. Signal influencing control 20 exchanges information with radiofrequency unit 19 via information line 27.

Radiofrequency unit 19 of influencing means 17 contains, in the way known for RFID transponders, a voltage regulating device for producing a supply voltage for influencing means 17 from a security signal received via nongalvanic coupling 25. Radiofrequency interface 19 furthermore contains a modulator unit for influencing a received security signal and a receiving unit for receiving and demodulating the security signal.

Signal influencing control 20 defines the manner of influencing a security signal received from security device 9. This could be realized in simple embodiments of an inventive data carrier system by delivering a predetermined stored information content, dispensing with a receiving unit of radiofrequency unit 19. In the present embodiment, however, information received from security device 9 is processed according to a predetermined algorithm and the processing result transferred to radiofrequency interface 19, which in turn modulates the reflection cross section of antenna 18 by load modulation.

Body 2 in the shown embodiment corresponds to the body of a chip card. Mask ROM 4 serves to store the standard commands of the operating system of the chip of said chip card. Nonvolatile memory area EEPROM 5 serves to store specific operating system commands and store additional program codes. Furthermore, EEPROM memory 5 serves as a data memory, for storing security-relevant data, among other things. The security-relevant data are protected by hidden addressing and can thus not be spied out.

Working memory 6 is a volatile memory and all information stored in said memory is lost when the supply voltage is switched off. Preferably, a memory is used having self-erasing memory cells, which immediately erase the memory content when the supply voltage is stopped, by switching the storage capacities of the individual memory cells to a fixed potential. When coupling apparatus 8 is a contact bank of a contact-type chip card, input/output device 7 contains a register with drivers for transferring data bit-by-bit.

In operation, i.e. when such a chip card is inserted into a reader, chip 16 is supplied with energy via coupling apparatus 8 and connection 29, and control unit 3 causes required data, including security-relevant data, to be taken over from nonvolatile data memory EEPROM 5 to working memory RAM 6. Before security-relevant data are taken over from the EEPROM to working memory 6, control unit 3 causes transmitting unit 10 to transmit a security signal via security signal line 21 and antenna 11. Said security signal contains a pseudo-random bit string that is also made available to evaluation means 13. The security signal radiated by antenna 11 is received by antenna 18 of influencing means 17 and passed on via security signal line 26 to radiofrequency unit 19. Radiofrequency unit 19 creates from the clock of the security signal a supply voltage for influencing means 17 and demodulates the security signal to extract the pseudo-random bit string and transfer it via information line 27 to signal influencing control 20. Upon the first occurrence of a security signal on antenna 18, radiofrequency unit 19 furthermore sets delay timer 20A to start a delay time.

Signal influencing control 20 applies to the bit string of the security signal an algorithm specific to this specific chip card to generate an influencing signal. Evaluation means 13 applies the same specific algorithm to the bit string of the security signal and thus likewise determines the influencing signal.

Signal influencing control 20 transfers the influencing signal determined thereby via information line 27 to radiofrequency unit 19, which in turn modulates the reflection cross section of antenna 18 with the influencing signal by load modulation. Said backscatter modulation on antenna 18 permits a receiver/demodulator contained in detection means 12 to detect the influenced security signal via antenna 11 and security signal line 21 and demodulate the influencing information. The information detected and extracted by detection means 12 is transferred via connection 22 to evaluation means 13, where it is compared with the information determined in evaluation means 13. If any deviations determined by evaluation means 13 between the influencing information detected by detection means 12 and the influencing information determined in the evaluation means are within a permissible tolerance range, the relevant part of the influenced security signal is considered recognized. If the influencing means has been removed or replaced by another similar influencing means, the evaluation means means, the evaluation means will not be able to determine said expected influencing information.

Radiofrequency interface 19 of influencing means 17 begins with load modulation only when delay timer 20A transfers a corresponding start signal to the radiofrequency interface after expiration of an individual delay time. Preferably, the time constant of delay timer 20A depends on the position of influencing means 17 relative to antenna 11 and/or to chip 16. Thus, the relative position between influencing means 17 and security device 9 is essential for the time period between the reception of a security signal by radiofrequency interface 19 and the starting of load modulation by radiofrequency interface 19.

Evaluation means 13 stores a delay time tolerance range specific to this particular chip card, which has preferably been determined after completion of the chip card. Evaluation means 13 compares the time period between delivery of a security signal via antenna 11 and detection of influencing information by detection means 12 with said defined tolerance range. If said time period is within the stated tolerance range, this part of the influenced security signal is also considered recognized. If influencing means 17 or chip 16 has been removed, even if the data carrier system was subsequently reassembled, there will be a change in the time constant defined by the arrangement of influencing means 17 and chip 16 or antenna 11. Thus, the evaluation means will not be able to determine said expected influencing information.

If the influencing information has an excessive error rate relative to the information determined in evaluation means 13, or if the time between delivery of a security signal and reception of influencing information is not within the predetermined tolerance range, evaluation means 13 passes blocking information to blocking means 14 to prevent blocking of the transfer of security-relevant data from EEPROM 5 to working memory 6.

In addition, the blocking information that blocking means 14 transfers to control unit 3 can also cause erasure of working memory 6.

In an especially favorable embodiment of such a portable data carrier system, the time constant of delay timer 20A is only started when certain start information transmitted by control unit 3 is determined in RF interface 19. Thus, the delay time is no longer immediately dependent on the easily determined turn-on time of influencing means 17.

The embodiment according to FIG. 1 relates to portable data carrier system 1 with relatively complicated security device 9 and accordingly complicated influencing means 17 to guarantee a high security standard. In contrast, the embodiment according to FIGS. 2 and 3 relates to a data carrier system with simply realized influencing means 17 and simply realized security device 9. The data carrier system according to FIGS. 2 and 3 is based on a system according to FIG. 1, so that FIGS. 2 and 3 only show functional units essential for the different mode of functioning of the embodiment.

Figure 2:
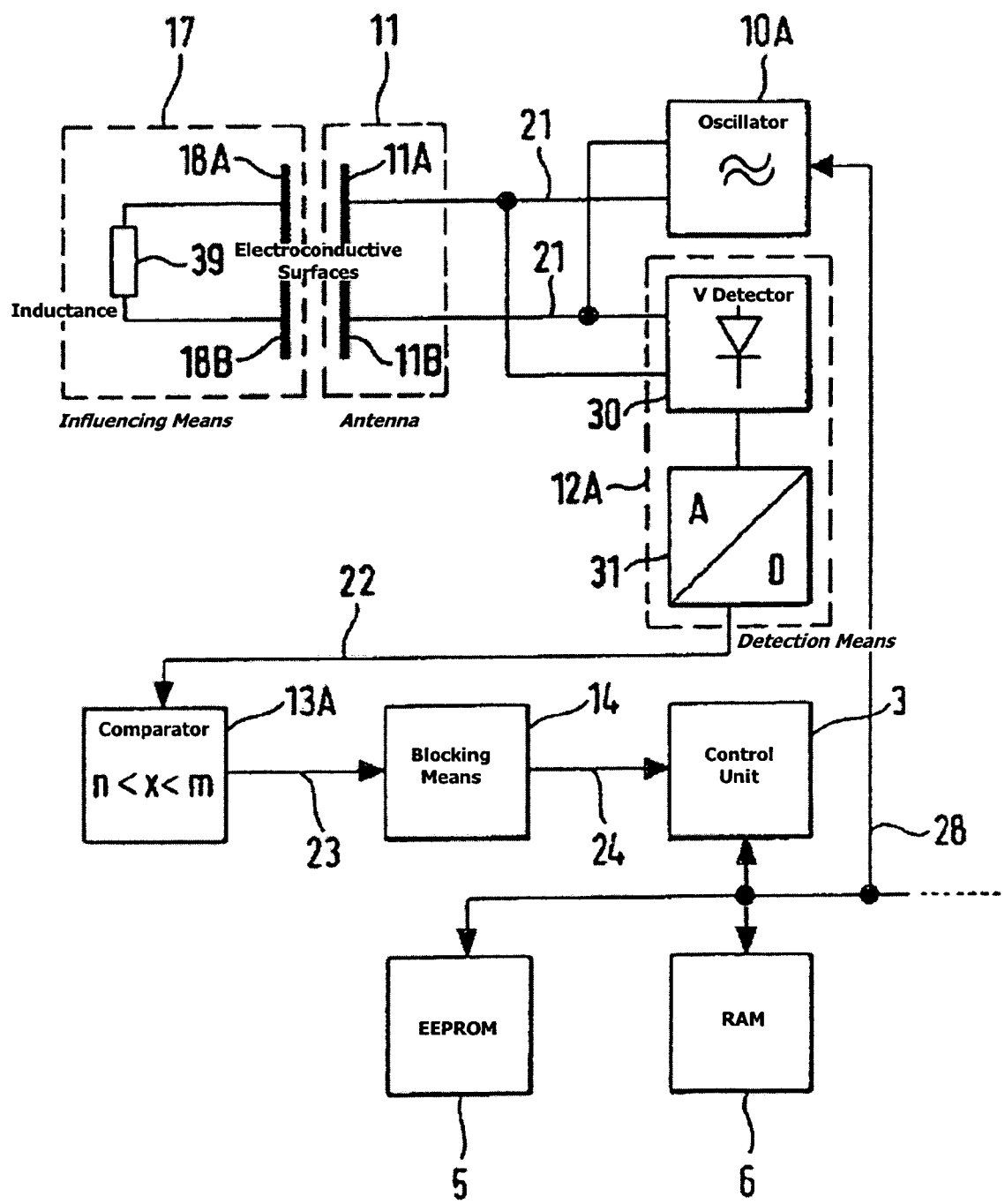
FIG. 2 shows a schematic block representation of that part of a second special embodiment of an inventive data carrier system that differs from the embodiment according to FIG. 1.

FIG. 2 shows control unit 3 for controlling the functional routines of the data carrier system, which is in operative connection via data and control bus 28 with EEPROM memory 5 and working memory 6 as well as oscillator 10A provided as a transmitting unit for delivering a security signal. Two output terminals of oscillator 10A are connected via security signal line 21 to input terminals of voltage detector 30 and to electroconductive surfaces 11A and 11B that together form coupling unit 11 of the security device. Electroconductive surface 11A forms together with electroconductive surface 18A of influencing means 17 a capacitance. Electroconductive surface 11B also forms together with electroconductive surface 18B of influencing means 17 a capacitance. Electroconductive surfaces 18A and 18B of influencing means 17 are interconnected via inductance 39, so that oscillator 10A is loaded with a series resonant circuit comprising the series circuit of capacitances 11A with 18A, 11B with 18B as well as inductance 39. The output amplitude of oscillator 10A depends very greatly on the deviation of the resonance frequency of stated resonant circuit 11A, 18A, 11B, 18B, 39 and the oscillator frequency of oscillator 10A. Said voltage detector 30, which is preferably a high-impedance root-mean-square value rectifier or peak value rectifier, forms together with analog-digital converter 31 detection means 12A with a digital signal output. The output of detection means 12A is connected via connection 22 for transferring the detected, influenced security signal with window comparator 13A pro-with window comparator 13A provided as the evaluation means. Window comparator 13A compares whether the output signal of analog-digital converter 31 and thus the oscillation amplitude or the mean voltage at the output of oscillator 10A is within a predetermined tolerance range. Window comparator 13A transfers the result of comparison via connection 23 to blocking means 14, which transfers blocking information to control unit 3 via connection 24 depending on the result of comparison. The tolerance range of window comparator 13A is preferably defined after completion of a data carrier system according to FIG. 2 with consideration of permissible deviations due to external influences.

Since the capacitances of the resonant circuit formed from coupling unit 11 and influencing means 17 are greatly dependent on the position of metallic surfaces 11A and 18A or 11B and 18B relative to each other, tampering with the data carrier system, in particular destruction of influencing means 17 or removal and reinsertion of influencing means 17, will lead with high probability to a strong deviation of the resonance frequency of resonant circuit 11A, 18A, 11B, 18B, 39 loading oscillator 10A. This has great effects on the output signal amplitude of oscillator 10A due to the strong frequency dependence of the impedance of a resonant circuit. Thus, window comparator 13A provided as the evaluation means can detect tampering with coupling unit 11 of the security device or with influencing means 17 with very high probability and accordingly cause blocking means 14 to deliver a blocking signal via connection 24.

Figure 3A:
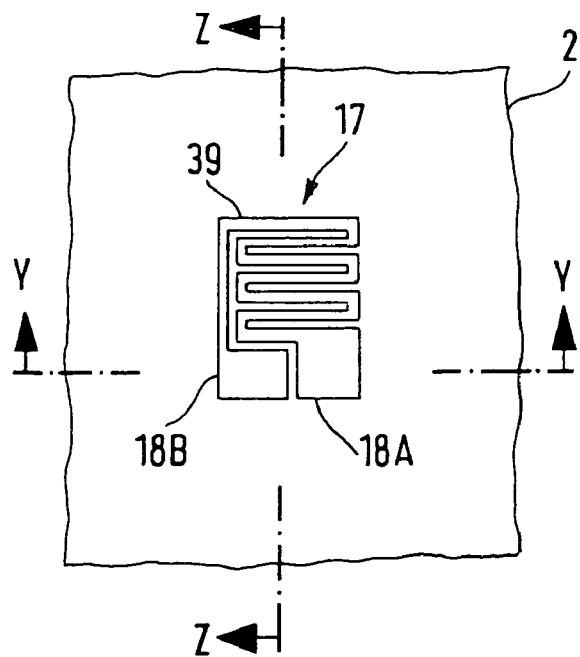
FIGS. 3A, B and C show schematic sectional views of a part of a possible form of realization of a data carrier system according to the embodiment from FIG. 2.
Figure 3B:
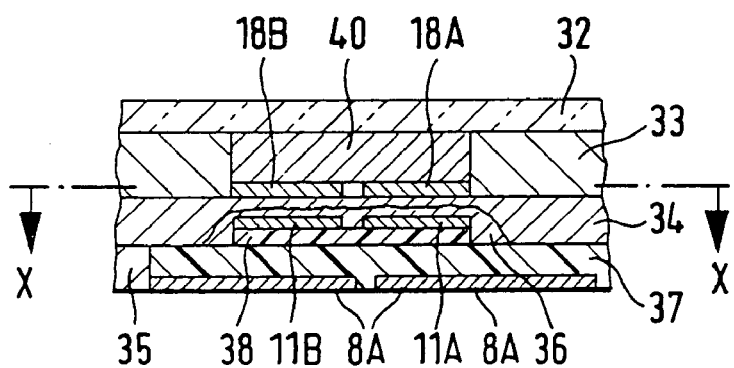
Figure 3C:
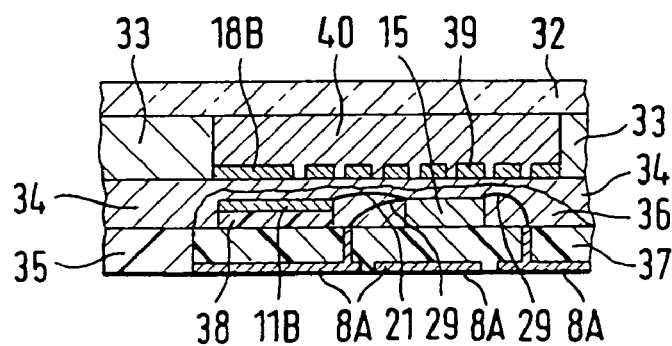

FIGS. 3A, 3B and 3C show sectional views through card body 2 in the area of the security device and the influencing means. In particular, an especially favorable influencing means is shown. FIG. 3A shows a portion of body 2 that is part of a contact-type chip card. In particular, a section along line x—x shown in FIG. 3B is depicted. FIG. 3A shows inductance 39 disposed between two metallic surfaces 18A and 18B. Said inductance can be formed as the metalized reflecting surface of hologram 40, as recognizable in FIG. 3B in the sectional view along cutting line y—y shown in FIG. 3A.

FIGS. 3B and 3C show sections through a contact-type chip card along cutting lines y—y and z—z shown in FIG. 3A. Said chip card consists of card body 2 with outside, preferably transparent card layer 32 shown on the top, inside card layer 33 receiving hologram module 40, inside card layer 34 adjacent thereto and receiving the chip of a chip card module, and outside card layer 35 shown at the bottom. Outside card layer 35 shown at the bottom receives carrier foil 37 of a chip module with external contacts 8A of a contact bank. The chip module consisting of carrier foil 37, external contact bank 8A, chip 15, adhesive foil 38, electroconductive surfaces 11A and 11B, chip cover 36 and connection wires 21 and 29 is so disposed below hologram module 40 that metallic surface 18B of the hologram module is disposed at a predetermined distance and with predetermined overlap relative to metallic surface 11B of the chip module, and metallic surface 18A of the hologram module is disposed accordingly opposite metallic surface 11A of the chip module to realize capacitors.

When the chip module or the metallic surface of hologram 40 is detached from the card with such a constellation of chip module and influencing means 17, no resonant circuit is applied to the output of oscillator 10A shown in FIG. 2. Accordingly, the output amplitude of oscillator 10A is very small compared with the output amplitude of the oscillator when loaded with a resonant circuit tuned to the oscillator frequency. Window comparator 13A in FIG. 2 can thus easily detect the absence of such a resonant circuit.

Even if metalization layer 18A, 18B, 39 of hologram module 40 or the chip module is subsequently reinstalled, the degree of overlap of capacitor electrodes 11A and 18A or 11B and 18B will with high probability no longer match the original degree of overlap. Furthermore, the distance between said capacitor electrodes will with high probability not be identical with the original distance. Consequently, the resonance frequency of the resonant circuit formed by subsequent assembly of the individual components of the data carrier system will not be identical with the resonance frequency of the original system. Such tampering with inventive data carrier system 1 will also be accordingly recognized by window comparator 13A, and blocking means 14 can cause blocking of a security-relevant function by control unit 3.

The invention claimed is:

1. A portable data carrier system having a control unit, a body giving the data carrier system its external form, a means for permitting information exchange between the control unit and an external access unit, and a data memory integrated in a chip, in which security-relevant data can be stored, a security device for transmitting a security signal, an influencing means integrated in the body and connected with the security device for influencing the security signal, a detection means of the stated security device for detecting the security signal influenced by the influencing means, an evaluation means for evaluating the detected, influenced security signal, and a blocking means for blocking a security-critical operating state of the data carrier system if the evaluation means does not recognize a security signal influenced in the expected way, characterized in that the security device is connected non-electrically with the influencing means, the transmitted security signal contains a bit string as the information, and the influencing means is designed to transmit a bit string altered from said bit string in a way predictable for the evaluation means to the detection means.

2. A data carrier system according to claim 1, characterized in that the detection means and the evaluation means are integrated at least partly in the chip, and the evaluation criterion of the evaluation means is an influenceable component of the security signal that depends significantly on the position and/or distance of the influencing means relative to at least one component of the security device.

3. A data carrier system according to claim 1, characterized in that the influencing means is a passive electric circuit effective in the radiofrequency range and causing frequency-dependent influencing of the security signal.

4. A data carrier system according to claim 1, characterized in that the influencing means comprises at least partly of a metal layer in the body.

5. A data carrier system according to claim 3, characterized in that the influencing means is a resonant circuit.

6. A data carrier system according to claim 1, characterized in that the influencing means is a transponder device.

7. A data carrier system according to claim 1, characterized in that the influencing means utilizes a metallic layer of an optically perceptible security feature.

8. A data carrier system according to claim 1, characterized in that the transponder device is supplied with energy by the security device.

9. A data carrier system according to claim 1, characterized in that the evaluation means can be calibrated to physical properties of the influencing means.

10. A data carrier system according to claim 9, characterized in that the security signal is a clock signal for energy supply of the transponder device.

11. A data carrier system according to claim 10, characterized in that the transponder device delivers stored information after being supplied with energy by the security signal.

12. A data carrier system according to claim 1, characterized in that the security device and thus the security signal transmitted thereby can be calibrated.

13. A data carrier system according to claim 1, characterized in that the amplitude of the detected, influenced security signal is provided as the evaluation criterion for the evaluation means.

14. A data carrier system according to claim 1, characterized in that the influencing means is disposed immediately adjacent to the chip in the body.

* * * * *